(12) United States Patent
Morell et al.

(10) Patent No.: US 6,891,111 B1
(45) Date of Patent: May 10, 2005

(54) SIGNAL PROCESSING IN A VEHICLE CLASSIFICATION SYSTEM

(75) Inventors: Scott Morell, White Lake Township, MI (US); Charles R. Cook, Jr., Rochester Hills, MI (US)

(73) Assignee: Siemens VDO Automotive Corporation, Auburn Hills, MI (US)

( * ) Notice: Subject to any disclaimer, the term of this patent is extended or adjusted under 35 U.S.C. 154(b) by 831 days.

(21) Appl. No.: 09/651,714

(22) Filed: Aug. 31, 2000

Related U.S. Application Data

(63) Continuation-in-part of application No. 09/548,485, filed on Apr. 13, 2000, which is a continuation of application No. 09/191,719, filed on Nov. 12, 1998, now Pat. No. 6,070,115.

(60) Provisional application No. 60/152,426, filed on Sep. 3, 1999, and provisional application No. 60/065,115, filed on Nov. 12, 1997.

(51) Int. Cl.$^7$ .......................... B60R 21/32; H03M 1/56; G01G 19/52

(52) U.S. Cl. ....................... 177/144; 180/273; 280/735; 341/169

(58) Field of Search .......................... 177/144, 210 R; 341/169; 280/735; 180/273

(56) References Cited

U.S. PATENT DOCUMENTS

| | | | |
|---|---|---|---|
| 2,708,005 A | 5/1955 | Gazzo | 280/735 |
| 3,022,976 A | 2/1962 | Zia | 297/216.18 |
| 3,766,344 A | 10/1973 | Nevett | 200/85 A |
| 3,824,584 A * | 7/1974 | Coia | 341/169 |
| 4,075,443 A | 2/1978 | Fatur | 200/85 A |
| 4,144,525 A * | 3/1979 | O'Neill | 341/169 |
| 4,257,034 A * | 3/1981 | Wilkinson | 341/169 |
| 5,071,160 A | 12/1991 | White et al. | 280/735 |
| 5,232,243 A | 8/1993 | Blackburn et al. | 280/732 |
| 5,413,378 A | 5/1995 | Steffens | 280/735 |
| 5,431,447 A | 7/1995 | Bauer | 280/805 |
| 5,454,591 A | 10/1995 | Mazur et al. | 280/735 |
| 5,474,327 A | 12/1995 | Schousek | 280/735 |
| 5,481,078 A | 1/1996 | Asche | 200/85 A |
| 5,502,284 A | 3/1996 | Meiller et al. | 200/85 A |
| 5,542,493 A | 8/1996 | Jacobson | 180/272 |
| 5,566,978 A | 10/1996 | Fleming et al. | 280/801.2 |
| 5,570,903 A | 11/1996 | Meister et al. | 280/735 |
| 5,573,269 A | 11/1996 | Gentry et al. | 280/735 |
| 5,605,348 A | 2/1997 | Blackburn et al. | 280/735 |

(Continued)

FOREIGN PATENT DOCUMENTS

| | | |
|---|---|---|
| DE | 3809074 | 10/1989 |
| DE | 196 14 523 A | 10/1996 |
| DE | 196 02 087 A1 | 7/1997 |
| DE | 19754166 | 6/1999 |
| EP | 0 656 283 B1 | 8/1997 |
| EP | 0 721 863 B1 | 5/2000 |
| JP | 9-150662 | 6/1997 |
| WO | WO 98/17508 A1 | 4/1998 |
| WO | 9849031 | 11/1998 |
| WO | WO 98/58821 A | 12/1998 |
| WO | 9924285 | 5/1999 |

OTHER PUBLICATIONS

Research Disclosure, RD399016, Anonymous, Jul. 1997.
International Search Report Date of Completion: Jul. 5, 2001.

*Primary Examiner*—Randy W. Gibson

(57) ABSTRACT

A vehicle weight classification system determines the weight of a seat occupant for controlling airbag deployment. Strain gauge sensors preferably provide signals having a magnitude that is indicative of the weight of the seat occupant. A converting module converts the sensor signals into timing information. A microprocessor, which includes a timer module, receives the timing information and makes a weight determination from the timing information.

12 Claims, 3 Drawing Sheets

U.S. PATENT DOCUMENTS

| | | |
|---|---|---|
| 5,612,876 A | 3/1997 | Zeidler et al. ......... 364/424.055 |
| 5,618,056 A | 4/1997 | Schoos et al. ............... 280/735 |
| 5,624,132 A | 4/1997 | Blackburn et al. ........... 280/735 |
| 5,626,359 A | 5/1997 | Steffens, Jr. et al. ........ 280/735 |
| 5,664,807 A | 9/1997 | Bohmler ..................... 280/805 |
| 5,670,853 A | 9/1997 | Bauer ......................... 318/286 |
| 5,678,854 A | 10/1997 | Meister et al. ............... 280/735 |
| 5,732,375 A | 3/1998 | Cashler ....................... 701/45 |
| 5,739,757 A | 4/1998 | Gioutsos ..................... 340/667 |
| 5,804,887 A | 9/1998 | Holzapfel ................... 280/735 |
| 5,810,392 A | 9/1998 | Gagnon ..................... 280/735 |
| 5,821,633 A | 10/1998 | Burke et al. ............... 307/10.1 |
| 5,864,295 A | 1/1999 | Jarocha ...................... 340/667 |
| 5,906,393 A | 5/1999 | Mazur et al. ............... 280/735 |
| 5,967,549 A | 10/1999 | Allen et al. ................. 280/735 |
| 5,971,432 A | 10/1999 | Gagnon ..................... 280/735 |
| 6,015,163 A | 1/2000 | Langford et al. ........... 280/735 |
| 6,039,344 A | 3/2000 | Mehney ..................... 280/735 |
| 6,040,532 A | 3/2000 | Munch ...................... 177/144 |
| 6,070,115 A | 5/2000 | Oestreicher et al. .......... 701/45 |
| 6,079,745 A | 6/2000 | Wier .......................... 280/806 |
| 6,087,598 A | 7/2000 | Munch ...................... 177/144 |
| 6,179,330 B1 | 1/2001 | Wier .......................... 280/806 |
| 6,313,415 B1 * | 11/2001 | Maher et al. ........... 177/210 R |

\* cited by examiner

SIGNAL PROCESSING IN A VEHICLE CLASSIFICATION SYSTEM

RELATED APPLICATIONS

This application claims priority to U.S. Provisional Application No. 60/152,426, which was filed on Sep. 3, 1999. This application is a Continuation-in-Part of U.S. application Ser. No. 09/548,485, filed on Apr. 13, 2000, which is a continuation of application Ser. No. 09/191,719, which was filed on Nov. 12, 1998, now U.S. Pat. No. 6,070,115, which claims the benefit of U.S. Provisional Application No. 60/065,115, which was filed on Nov. 12, 1997.

BACKGROUND OF THE INVENTION

In general terms, this invention relates to vehicle weight classification systems for classifying the weight of an occupant on a vehicle seat. More particularly, this invention relates to a signal processing system and method for handling weight information in a vehicle weight classification system.

Modern day vehicles typically include safety restraints to protect passengers and drivers during impact. Such restraints include seat belts and airbags, for example. It has recently become apparent that customized control of airbags is desirable. The owner of this application has developed a vehicle weight classification system that is useful for determining the size or weight of a seat occupant and controlling an airbag deployment responsive to that determination.

One of the challenges in designing a weight classification system is keeping the system simple and robust. For example, there are limited choices among sensor arrangements that will provide desired results over the life of a vehicle seat. Additionally, space constraints and economic considerations place limitations on the components to be included in such a system.

One particular challenge is presented in processing signals that are available from conventional-type sensors that provide signals indicative of the seat occupant's weight. In one example, strain gauge sensors are used in a vehicle seat. The strain gauge sensors provide electrical signals indicative of the weight on the seat. Typical strain gauge sensor output, however, is not readily usable by a microprocessor with out special modification. The sensor signals are typically too weak to be immediately recognized. Further, typical analog-to-digital converters provided on conventional microcontrollers do not have sufficient resolution capability to make an accurate enough weight determination.

This invention provides a solution that converts such sensor signal information into a useful form that is readily used within a single microcontroller that preferably is also responsible for other operations of the weight classification system.

SUMMARY OF THE INVENTION

In general terms, this invention is a vehicle weight classification system useful for determining the size or weight of a seat occupant in the vehicle. A system designed according to this invention includes at least one sensor that provides a signal indicative of the seat occupant's weight. A converting module converts the sensor signal into timing information. A controller has a timer module that communicates with the converting module such that the controller determines the weight of the seat occupant as sensed by the sensor from the timing information. Using the timing information allows the controller to more accurately and more readily make a weight determination.

A method according to this invention includes several basic steps. First, the signal indicating the weight is generated. Next, timing information from that signal is determined. The weight information is then determined from the timing information. In a preferred embodiment, the timing information is received by a timer module on a microprocessor. The microprocessor preferably determines the weight information based upon the timing information rather than directly from a signal directly from the sensor.

The various features and advantages of this invention will become apparent to those skilled in the art from the following detailed description of the currently preferred embodiment. The drawings that accompany the detailed description can be briefly described as follows.

DETAILED DESCRIPTION OF THE PREFERRED EMBODIMENT

Figure 1:
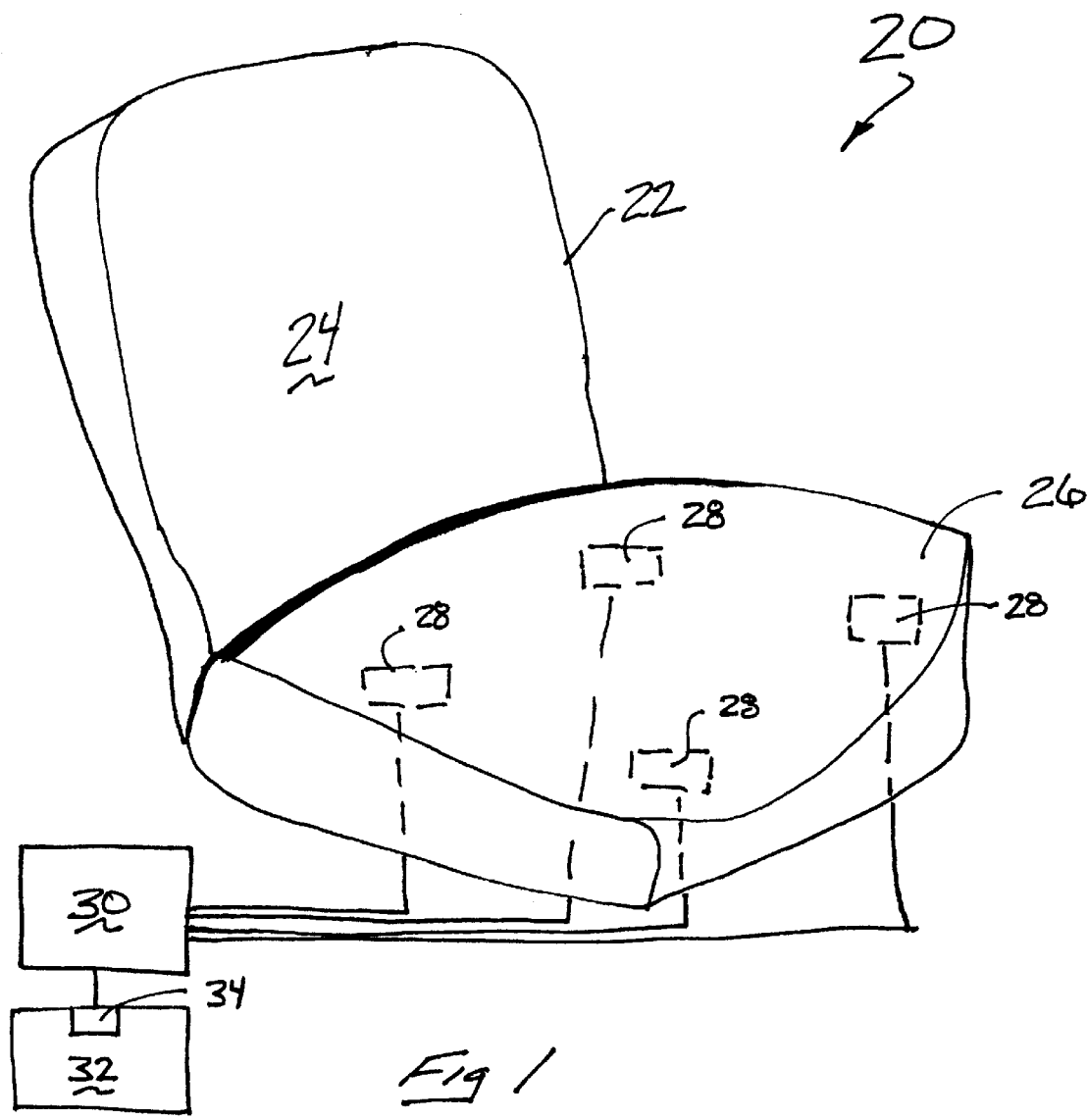
FIG. 1 diagrammatically illustrates a system designed according to this invention.

A vehicle weight classification system 20 is schematically illustrated in FIG. 1. A seat 22 includes a seat back 24 and a seat base portion 26. A plurality of sensors 28 are associated with the seat 22 and preferably supported in the seat base 26. The sensors 28 preferably are strain gauge sensors that provide an electrical signal indicative of a seat occupant's weight.

The signals from the sensors 28 are processed by a converting module 30, which provides timing information corresponding to the magnitude of the signals from the sensors 28. The magnitude of the sensor signals preferably is indicative of the seat occupant's weight. Although a single converting module 30 is illustrated for discussion purposes, it is within the scope of this invention to provide an individual converting module associated with each individual sensor 28.

A system controller 32 preferably includes a timer module 34 that communicates with the converting module 30. The timer module 34 receives an output from the converting module and the controller 32 preferably is programmed to use timing information from the output of the converting module 30 as the basis for determining the seat occupant's weight.

Figure 2:
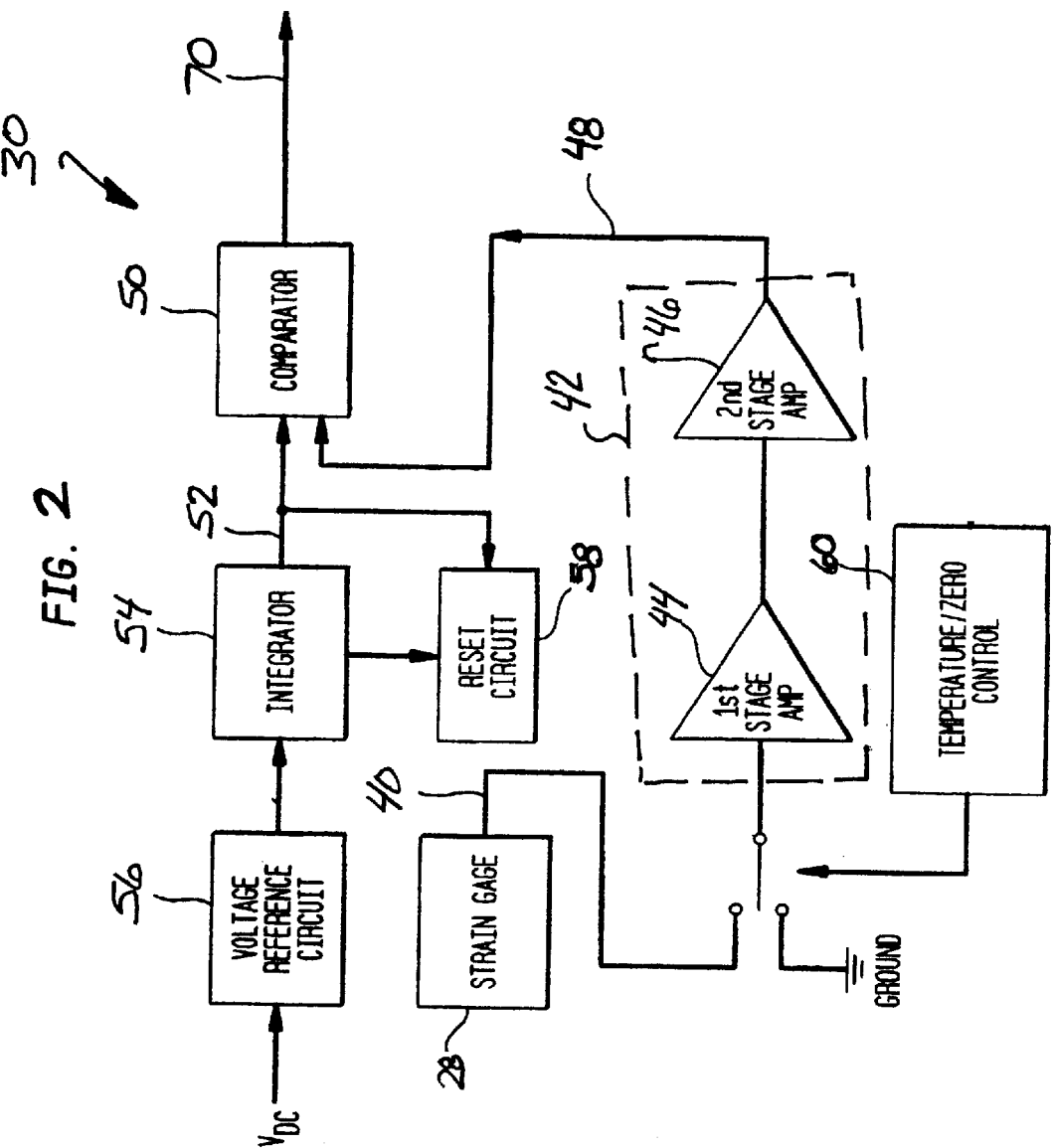
FIG. 2 is a schematic diagram illustrating a preferred embodiment of circuitry used with this invention.

FIG. 2 schematically illustrates a preferred embodiment of the converting module 30. An output 40 from each sensor 28 preferably is amplified using an amplifier 42. The preferred embodiment of the amplifier 42 is a two-stage amplifier including a first stage 44 and a second stage 46. The amplified sensor signal 48 is provided to a comparator 50. The other input 52 to the comparator 50 is an output of a reference signal generator 54. In the illustrated example, the reference signal generator is an integrator that is provided with a reference voltage from the voltage reference circuit 56. A reset circuit 58 preferably is provided so that the reference signal 52 has a time-dependent pattern or cycle. A temperature sensor and zero control circuit portion 60 preferably senses temperature and provides signal zero function. The temperature information preferably is used by the controller to compensate for temperature behavior of this strain gauge signal 40. The same output 80 can be used as a zero function command input by the controller. Zero function preferably is used to short out the strain gauge input signal to measure the weight signal zero off set. The zero off set measurement then preferably is compensated in the controller such that the signal is properly processed to ascertain the weight information.

Figure 3A:
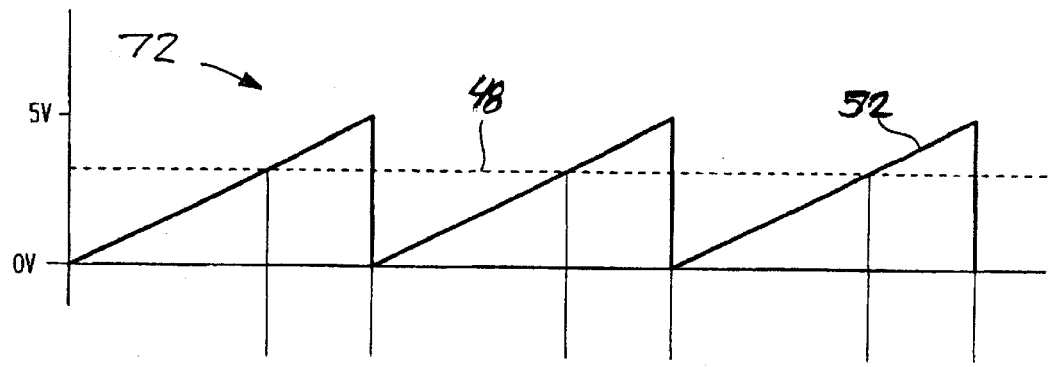
FIG. 3A is a graphical illustration of a reference signal used with this invention.

In one example implementation of this invention, the reference signal generator 54 provides a saw-tooth shaped signal 52 as seen in FIG. 3A. The amplified sensor signal 48 and the reference signal 52 preferably are provided to the comparator 50, which provides an output 70 that includes timing information that is received by the timer module 34 on the controller 32. The plot 72 in FIG. 3A graphically illustrates a relationship between the amplified sensor signal 48 and the reference signal 52.

Figure 3B:
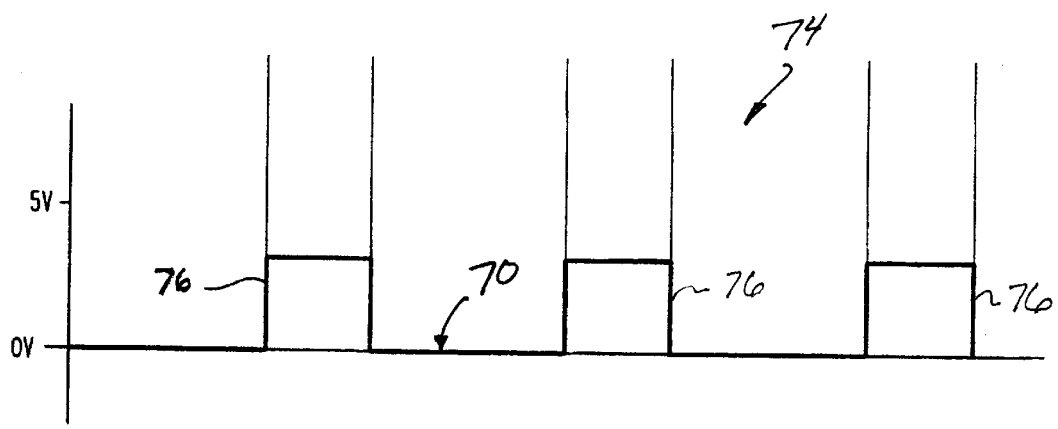
FIG. 3B is a graphical illustration of a preferred final output signal used with this invention.

FIG. 3B is a plot 74 of pulses 76, which comprise the output 70 from the comparator 50. In the illustrated example, whenever the reference signal 52 has a value that is greater than the magnitude of the amplified sensor signal 48, the comparator 50 provides a logic high output until such time that the reference signal falls below the magnitude of the amplified sensor signal 48. This relationship between the amplified sensor signal 48 and the reference signal 52 provides timing information that is indicative of the weight of the seat occupant. In the illustrated example, the width of each pulse 76 is interpreted by the controller 32 to determine the seat occupant's weight. The controller 32 preferably is programmed to utilize the timing information from the output 70 of the comparator to make an appropriate weight determination. Given this description, those skilled in the art will be able to appropriately program a commercially available microprocessor to accomplish the results needed for a particular situation.

A significant advantage to this invention is that output signals from sensors, such as strain gauge sensors, are converted in a manner that enables a conventional microprocessor to make a more accurate weight determination. If, for example, the sensor outputs were fed directly to an analog-to-digital converter on the microprocessor, there typically is not enough resolution to make an accurate weight determination. Further, the nature of such output signals of such strain gauge sensors does not lend itself to be readily and accurately handled by a microprocessor to make a weight determination. Utilizing a signal converting module 30 designed according to this invention provides greater accuracy in making a weight determination than would otherwise be available using typical microprocessors.

The preceding description is exemplary rather than limiting in nature. Variations and modifications to the disclosed embodiment may become apparent to those skilled in the art that do not necessarily depart from the purview and spirit of this invention. The scope of legal protection given to this invention can only be determined by studying the following claims.

We claim:

1. A method of determining weight information in a vehicle weight classification system having at least one sensor that generates a signal indicative of weight and a controller that communicates with the sensor, comprising the steps of:
   (A) generating a signal indicative of weight;
   (B) determining timing information from the signal of step (A); and
   (C) determining the weight information from the timing information of step (B), using the controller.

2. The method of claim 1, wherein step (A) is performed using a strain gauge sensor and the magnitude of the signal is indicative of weight.

3. The method of claim 1, wherein step (B) includes generating a pulse width modulated signal that has a width that is indicative of the magnitude of the analog signal.

4. The method of claim 3, wherein step (C) includes using the width of the pulse width modulated signal to derive the weight information.

5. The method of claim 4, wherein step (C) is performed using a timer in the controller.

6. The method of claim 1, including amplifying the signal of step (A), comparing the amplified signal to a reference signal and determining a time that the amplified signal has a chosen relationship to the reference signal to thereby determine the timing information from the signal of step (A).

7. The method of claim 1, wherein step (B) is performed using a pulse width modulating circuit and step (C) is performed using a timer on the controller.

8. A vehicle weight classification system, comprising:
   at least one sensor that provides a signal indicative of a weight;
   a converting module that converts the sensor signal into timing information; and
   a controller that has a timer module that communicates with the converting module such that the controller determines the weight sensed by the sensor from the timing information.

9. The system of claim 8, wherein the sensor comprises a strain gauge sensor supported on a vehicle seat, the sensor producing a signal responsive to a weight on the seat, the signal having a magnitude that is indicative of the weight.

10. The system of claim 8, wherein the converting module includes an amplifier that amplifies the signal from the sensor, a reference portion that generates a reference signal and a comparator portion that compares the amplified signal to the reference signal.

11. The system of claim 10, wherein the comparator portion produces a signal that has timing information that is indicative of a relationship between the amplified sensor signal and the reference signal.

12. The system of claim 11, wherein the controller timer module receives the comparator portion signal and the controller interprets timing information from the comparator portion signal and determines the weight from the timing information.

* * * * *